US007965497B2

(12) United States Patent
Kwon et al.

(10) Patent No.: US 7,965,497 B2

(45) Date of Patent: Jun. 21, 2011

(54) FLAT PANEL DISPLAY APPARATUS AND METHOD OF MANUFACTURING THE SAME

(75) Inventors: Oh-June Kwon, Suwon-si (KR); Seung-Yong Song, Suwon-si (KR); Young-Seo Choi, Suwon-si (KR); Kwan-Hee Lee, Suwon-si (KR); Sun-Young Jung, Suwon-si (KR); Ji-Hun Ryu, Suwon-si (KR); Young-Cheol Joo, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 90 days.

(21) Appl. No.: 12/413,948

(22) Filed: Mar. 30, 2009

(65) Prior Publication Data

US 2010/0008026 A1 Jan. 14, 2010

(30) Foreign Application Priority Data

Jul. 14, 2008 (KR) ................................ 2008-68341

(51) Int. Cl.
*H05K 5/00* (2006.01)
*H05K 7/00* (2006.01)
*G02F 1/1333* (2006.01)

(52) U.S. Cl. ........................ 361/679.21; 349/56; 349/58

(58) Field of Classification Search ............. 361/679.21; 349/56, 58, 84, 96, 122
See application file for complete search history.

(56) References Cited

U.S. PATENT DOCUMENTS 4,640,583 A * 2/1987 Hoshikawa et al. .......... 349/153
7,791,262 B2 * 9/2010 Seon et al. .................... 313/495

FOREIGN PATENT DOCUMENTS

| | | |
|---|---|---|
| JP | 6-222317 | 8/1994 |
| JP | 1998-31223 | 2/1998 |
| JP | 2005-234302 | 9/2005 |
| KR | 1020070083149 A | 8/2007 |

OTHER PUBLICATIONS

Korean Office Action dated Jun. 22, 2010, issued in corresponding Korean Patent Application No. 10-2008-0068341.
Korean Office Action issued on Nov. 16, 2010 in the corresponding Korean Patent Application No. 10-2009-0033189 and Request for Entry of the Accompanying Document herewith.
Korean Office Action issued on Dec. 20, 2010 in the corresponding Korean Patent Application No. 10-2008-0068341 and Request for Entry of the Accompanying Document herewith.

* cited by examiner

*Primary Examiner* — Jayprakash N Gandhi
*Assistant Examiner* — Anthony M Haughton
(74) *Attorney, Agent, or Firm* — Robert E. Bushnell, Esq.

(57) ABSTRACT

A flat panel display apparatus including: a mother substrate; a display unit provided on the mother substrate; an opposing mother substrate facing the mother substrate such that the display unit is interposed between the mother substrate and the opposing mother substrate; a sealing member provided between the mother substrate and the opposing mother substrate to contact the substrate and/or the opposing mother substrate and arranged outside or along a periphery of the display unit; and an auxiliary layer provided between the mother substrate and the opposing mother substrate to prevent a warpage of the mother substrate and/or the opposing mother substrate.

21 Claims, 7 Drawing Sheets

FLAT PANEL DISPLAY APPARATUS AND METHOD OF MANUFACTURING THE SAME

CROSS-REFERENCE TO RELATED APPLICATION

This application claims the benefit of Korean Patent Application No. 2008-68341, filed Jul. 14, 2008 in the Korean Intellectual Property Office, the disclosure of which is incorporated herein by reference.

BACKGROUND OF THE INVENTION

1. Field of the Invention

Aspects of the present invention relate to a flat panel display apparatus and a manufacturing method thereof, and more particularly, to a flat panel display apparatus that reduces the rate of defects that may be generated in a process of simultaneously manufacturing a plurality of flat panel display apparatuses, and a manufacturing method thereof.

2. Description of the Related Art

In general, a flat panel display apparatus has a structure in which a display unit is formed between a substrate and an opposing substrate that face each other. In a process of manufacturing a flat panel display apparatus having the above structure, a plurality of flat panel display apparatuses are manufactured in a single manufacturing process to save manufacturing cost and time.

FIG. 1 is a cross-sectional view showing a manufacturing process of a conventional flat panel display apparatus. Referring to FIG. 1, a mother substrate 10 and an opposing mother substrate 30 are arranged such that a display unit 20 is interposed therebetween. A sealing member 40 formed on the opposing mother substrate 30 faces the mother substrate 10. In this structure, a laser beam is radiated toward the sealing member 40 to melt and cure the sealing member 40 so that the mother substrate 10 and the opposing mother substrate 30 are combined by the sealing member 40.

FIGS. 2A-2D are images showing changes in the thickness of the sealing member 40 when the mother substrate 10 and the opposing mother substrate 30 are combined. When a sealing member having a thickness of approximately 8.97 μm, as shown in FIG. 2A, undergoes a laser sealing process, the thickness of the sealing member is decreased to approximately 7.58 μm, as shown in FIG. 2B. Also, when a sealing member having a thickness of approximately 9.74 μm, as shown in FIG. 2C, undergoes the laser sealing process, the thickness of the sealing member is decreased to approximately 7.47 μm, as shown in FIG. 2D. Accordingly, since the thickness of the sealing member is decreased during the laser sealing, a defect is generated.

In detail, when the laser sealing process is performed on the flat panel display apparatus shown in FIG. 1, a laser beam is not simultaneously radiated to all of the sealing members 40, but is radiated in sequence (i.e., the laser sealing process is performed in sequence). For example, the laser beam is first radiated to the sealing member 40 at the leftmost position in FIG. 1 so that the mother substrate 10 and the opposing mother substrate 30 are combined by the sealing member 40. Then, the laser beam is sequentially radiated to the sealing members 40 arranged to the right of the leftmost sealing member 40 so that the mother substrate 10 and the opposing mother substrate 30 are combined to each other. In this process, as shown in FIGS. 2A-2D, since the thickness of the sealing member 40 in an area where the laser sealing process is completed by the radiation of the laser beam is less than that of the sealing member 40 in an area where the laser beam is not radiated, warpage results in the mother substrate 10 and/or the opposing mother substrate 30.

Accordingly, even when the laser sealing process of the sealing member 40 is completed for all areas, the warpage may still remain in the mother substrate 10 and/or the opposing mother substrate 30. As a result, when a plurality of flat panel display apparatuses are manufactured by cutting portions C1 and C2 as shown in FIG. 1, warpage may result in a cut surface as the mother substrate 10 and the opposing mother substrate 30 are not clearly cut. Also, as the thickness of the sealing member is decreased from approximately 8.97 μm to approximately 7.58 μm, as shown in FIGS. 2A and 2B, and the thickness of the sealing member is decreased from approximately 9.74 μm to approximately 7.47 μm, as shown in FIGS. 2C and 2D, a thickness decrease rate may vary. Thus, as the thickness decrease rate of the sealing member changes, a defect may result (for example, an interval between the mother substrate 10 and the opposing mother substrate 30 may be inconsistent across the flat panel display apparatus).

SUMMARY OF THE INVENTION

Aspects of the present invention provide a flat panel display apparatus that reduces the rate of defects that may be generated in a process of simultaneously manufacturing a plurality of flat panel display apparatuses, and a manufacturing method thereof.

According to an aspect of the present invention, there is provided a flat panel display apparatus including: a mother substrate; a display unit provided on the mother substrate; an opposing mother substrate facing the mother substrate such that the display unit is interposed between the mother substrate and the opposing mother substrate; a sealing member provided between the mother substrate and the opposing mother substrate to contact the mother substrate and/or the opposing mother substrate, and arranged outside or along a periphery of the display unit; and an auxiliary layer provided between the mother substrate and the opposing mother substrate to prevent warpage of the mother substrate and/or the opposing mother substrate.

The auxiliary layer may contact the mother substrate and the opposing mother substrate.

The auxiliary layer may include a portion having a section that is perpendicular to the mother substrate and a cross-sectional area that increases in a predetermined direction.

The flat panel display apparatus may further include a plurality of auxiliary layers that are discontinuously arranged along an end portion of the opposing mother substrate.

At least one of the plurality of auxiliary layers may include a portion having a section that is perpendicular to the mother substrate and a cross-sectional area that increases in a predetermined direction.

The flat panel display apparatus may further include a filling member provided on an opposite side of the sealing member as compared to the display unit, and filling a space between the mother substrate and the opposing mother substrate.

An outer end surface of the filling member may be aligned with an end surface of the opposing mother substrate.

The sealing member and the auxiliary layer may be formed of the same material.

The sealing member and/or the auxiliary layer may be formed of sealing glass frit.

The auxiliary layer may be arranged between an end portion of the mother substrate and the sealing member.

According to another aspect of the present invention, there is provided a method of manufacturing a flat panel display apparatus including: providing a plurality of display units on a mother substrate; forming a plurality of sealing members and a plurality of auxiliary layers on an opposing mother substrate and/or the mother substrate, each of the plurality of sealing members respectively provided outside or along a periphery of each of each of the plurality of display units such that each of the plurality of display units is surrounded by the corresponding sealing members; arranging the mother substrate and the opposing mother substrate to face each other with the plurality of display units interposed between the mother substrate and the opposing mother substrate; combining the mother substrate and the opposing mother substrate by melting the plurality of sealing members; and forming a plurality of display panels by cutting the mother substrate and the opposing mother substrate such that each display panel has one of the plurality of display units.

The forming of the plurality of sealing members and the plurality of auxiliary layers on the mother substrate may include forming the plurality of sealing members and the plurality of auxiliary layers such that a height of each of the plurality of sealing members is greater than a height of each of the plurality of auxiliary layers.

The combining of the mother substrate and the opposing mother substrate may include combining the mother substrate and the opposing mother substrate by melting the plurality of sealing members such that the plurality of auxiliary layers contact the mother substrate or the opposing mother substrate by reducing the height of each of the plurality of sealing members.

One or more of the plurality of auxiliary layers may include a portion having a section that is perpendicular to the mother substrate and a cross-sectional area that increases in a predetermined direction.

The plurality of auxiliary layers may be discontinuously arranged.

The method may further including forming a plurality of filling members respectively filling a space between the mother substrate and the opposing mother substrate outside an area surrounded by the corresponding sealing members.

The plurality of sealing members and the plurality of auxiliary layers may be formed of the same material.

The plurality of sealing members and/or the plurality of auxiliary layers may be formed of sealing glass frit.

According to another aspect of the present invention, there is provided a flat panel display apparatus including: a mother substrate; a display unit provided on the mother substrate; an opposing mother substrate facing the substrate such that the display unit is interposed between the mother substrate and the opposing mother substrate; a sealing member provided between the mother substrate and the opposing mother substrate to contact the mother substrate and/or the opposing mother substrate, and arranged outside or along a periphery of the display unit; a first auxiliary layer provided between the mother substrate and the opposing mother substrate, on a first side of the display unit; and a second auxiliary layer provided between the mother substrate and the opposing mother substrate, on a second side of the display unit, opposite the first side, wherein the first auxiliary layer and the second auxiliary layer have a same height that is equal to a height of the sealing member.

According to another aspect of the present invention, there is provided a method of manufacturing a flat panel display apparatus, the method including: providing a display unit on a mother substrate; forming a sealing member and an auxiliary layer on an opposing mother substrate and/or the mother substrate, the sealing member provided outside or along a periphery of the display unit; arranging the mother substrate and the opposing mother substrate to face each other with the display unit interposed between the mother substrate and the opposing mother substrate; and combining the mother substrate and the opposing mother substrate by melting the sealing member to form a display panel.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
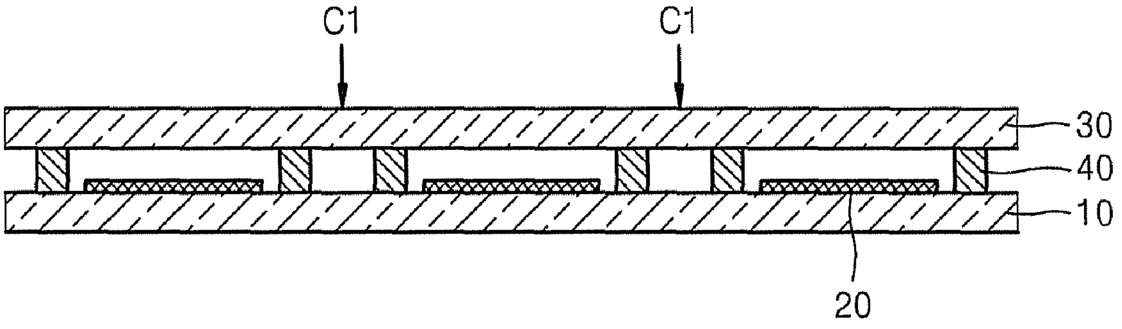
FIG. 1 (CONVENTIONAL ART)
FIG. 1 is a cross-sectional view showing a manufacturing process of a conventional flat panel display apparatus.
Figure 2A:
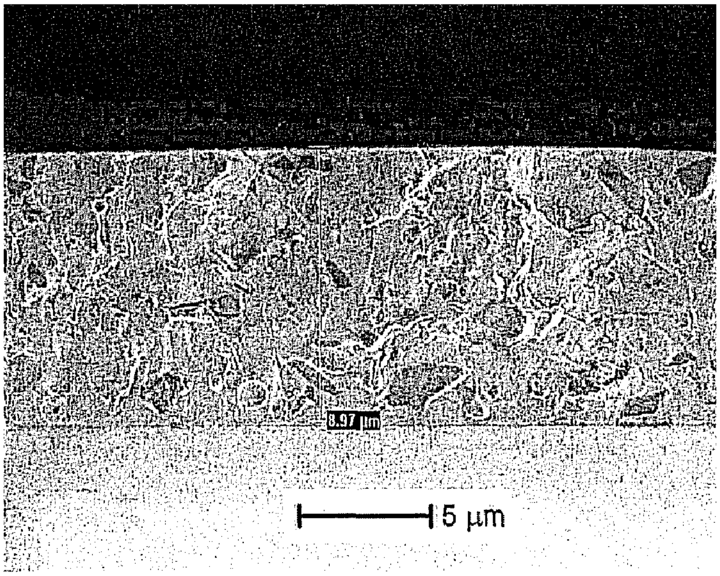
FIG. 2A (CONVENTIONAL ART)
FIGS. 2A-2D are images showing changes in a thickness of a sealing member when a mother substrate and an opposing mother substrate are combined.
Figure 2B:
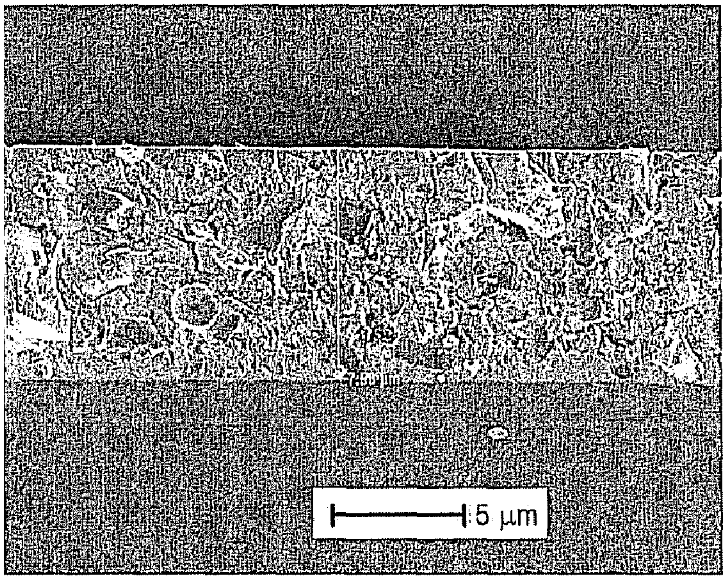
FIG. 2B (CONVENTIONAL ART)
Figure 2C:
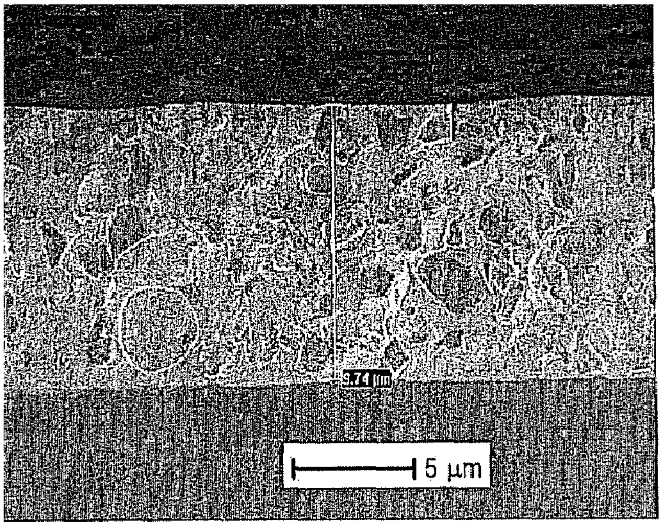
FIG. 2C (CONVENTIONAL ART)
Figure 2D:
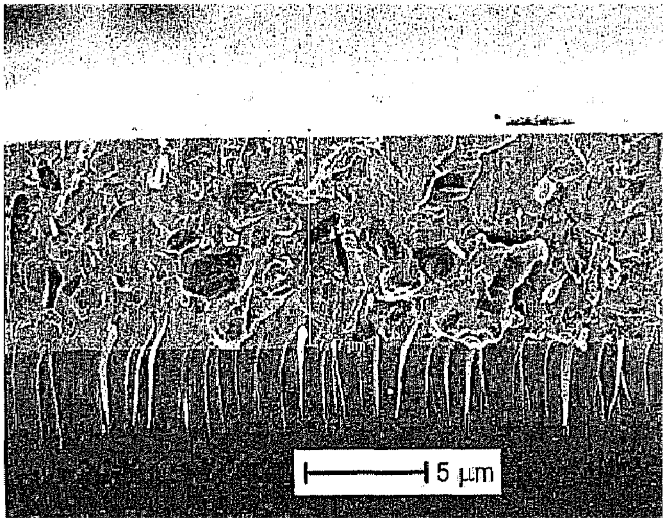
FIG. 2D (CONVENTIONAL ART)

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3A:
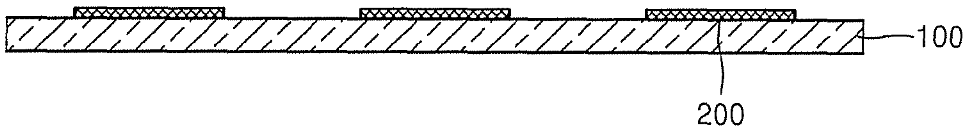
FIGS. 3A-3D are cross-sectional views showing a manufacturing process of a flat panel display apparatus according to an embodiment of the present invention.

FIGS. 3A-3D are cross-sectional views showing a manufacturing process of a flat panel display apparatus according to an embodiment of the present invention. Referring to FIG. 3A, a plurality of display units 200 are formed on a mother substrate 100. The mother substrate 100 may be formed of various materials (such as glass or plastic). The display units 200 may include organic light emitting devices, field emission display devices, liquid crystal display devices, etc.

Figure 3B:
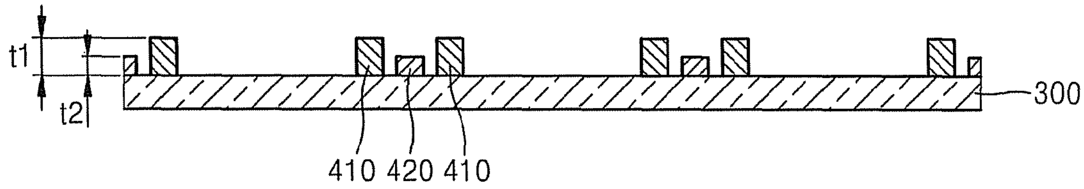
Figure 3C:
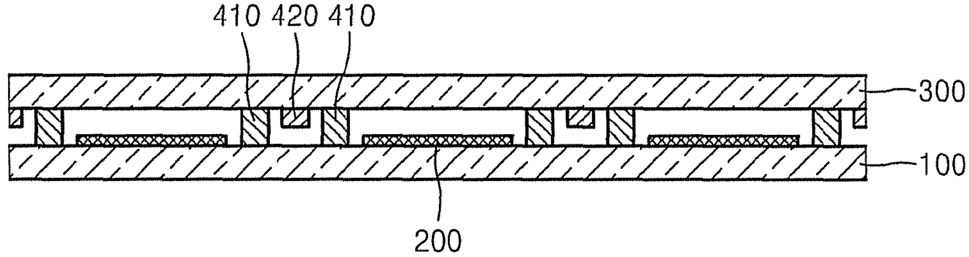

Also, referring to FIG. 3B, a plurality of sealing members 410 and a plurality of auxiliary layers 420 are formed on the opposing mother substrate 300. When the opposing mother substrate 300 is arranged to face the mother substrate 100 with the display units 200 interposed therebetween (as shown in FIG. 3C), the sealing members 410 are arranged on a periphery of the display units 200 on the opposing mother substrate 300. Accordingly, each of the display units 200 is surrounded by the sealing members 410. The auxiliary layers 420 are arranged on the opposing mother substrate 300 outside of an area surrounded by the sealing members 410. For example, the auxiliary layers 420 may be arranged between neighboring sealing members 410 or between an end portion of the opposing mother substrate 300 and the sealing members 410.

The sealing member 410 may be formed of various materials (such as sealing glass frit or other inorganic substances). The auxiliary layers 420 may be formed of various materials, and/or may be formed of the same material as that of the sealing member 410. When the sealing members 410 and the auxiliary layers 420 are formed using sealing glass frit, a printing method is used to form the sealing members 410 and the auxiliary layers 420. When the printing method is used, the shapes and thicknesses of the sealing members 410 and the auxiliary layers 420 are controllable. For example, a process of pre-firing at a temperature of about 400-500° C. is performed and a process of curing the sealing members 410 and the auxiliary layers 420 is performed.

The formation of the display units 200 on the mother substrate 100 as shown in FIG. 3A may precede the formation of the sealing members 410 and the auxiliary layers 420 on the opposing mother substrate 300 as shown in FIG. 3B. However, it is understood that aspects of the present invention are not limited thereto. For example, the formation of the sealing members 410 and the auxiliary layers 420 on the opposing mother substrate 300 as shown in FIG. 3B may precede or be simultaneous to the formation of the display units 200 on the mother substrate 100 as shown in FIG. 3A.

As shown in FIGS. 3A and 3B, after the above-described processes on the mother substrate 100 and the opposing mother substrate 300 are completed, the mother substrate 100 and the opposing mother substrate 300 are positioned such that the display units 200 can be positioned therebetween as shown in FIG. 3C. As the sealing members 410 are melted by radiating a laser beam to a portion where the sealing members 410 are positioned, the mother substrate 100 and the opposing mother substrate 300 are combined, as shown in FIG. 3D.

When the mother substrate 100 and the opposing mother substrate 300 are combined, the height of each of the sealing members 410 decreases. However, unlike the conventional flat panel display apparatus manufacturing process, in the flat panel display apparatus manufacturing process according to the present embodiment, the height of each of the sealing members 410 does not decrease to less than the height of each of the auxiliary layers 420. Accordingly, a rate of warpage generated in the mother substrate 100 and/or the opposing mother substrate 300 is remarkably reduced compared to the conventional flat panel display apparatus manufacturing process. Even when the warpage is generated, the size of the warpage is remarkably reduced compared to the size of the warpage generated in the conventional flat panel display apparatus manufacturing process. In particular, by forming the height of each of the auxiliary layers 420 to be constant when the auxiliary layers 420 are formed on the opposing mother substrate 300, the interval between the mother substrate 100 and the opposing mother substrate 300 after the mother substrate 100 and the mother substrate opposing substrate 300 are combined by radiating a laser beam to the sealing members 410 is maintained constant. When the laser beam is radiated to the sealing members 410, the laser beam is prevented from being radiated to the auxiliary layers 420. Accordingly, even when the auxiliary layers 420 and the sealing members 410 are formed of the same material, the auxiliary layers 420 do not melt.

Figure 3D:
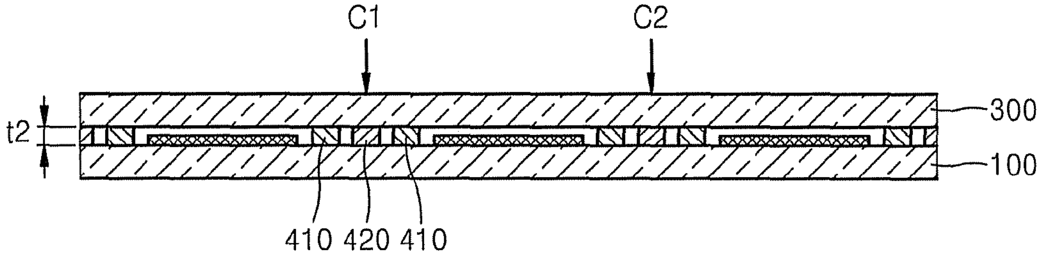
Figure 3E:
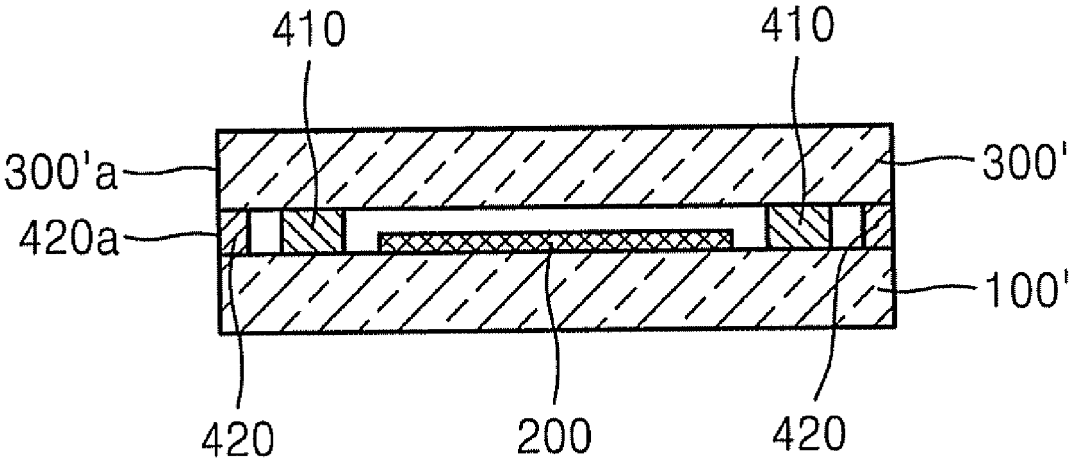
FIG. 3E is a cross-sectional view of a flat panel display apparatus manufactured in the manufacturing process as shown in FIGS. 3A-3D.

After the mother substrate 100 and the opposing mother substrate 300 are combined as shown in FIG. 3D, a flat panel display apparatus as shown in FIG. 3E is manufactured by cutting the mother substrate 100 and the mother substrate opposing substrate 300 in portions C1 and C2. The positions C1 and C2 to be cut may be portions where the auxiliary layers 420 are arranged. In detail, a plurality of display panels may be formed by cutting the mother substrate 100 and the opposing mother substrate 300 according to the positions of the auxiliary layers 420.

Referring to FIG. 3E, a flat panel display apparatus includes: a substrate 100'; a display unit 200 arranged on the substrate 100'; an opposing substrate 300' arranged to face the substrate 100' such that the display unit 200 is positioned inside; the sealing members 410 arranged between the substrate 100' and the opposing substrate 300' to contact the substrate 100' and the opposing substrate 300' and arranged outside or along an edge of each of the display units 200 such that the display units 200 are positioned inside; and the auxiliary layers 420 arranged between the substrate 100' and the opposing substrate 300' and having an outer end surface 420*a* aligned with an end surface 300'*a* of the opposing substrate 300'. In the flat panel display apparatus configured as above, warpage is prevented from being generated, or minimized, in the substrate 100' and/or the opposing substrate 300'. Also, the generation of blur in the end surface due to cutting is minimized. Furthermore, the interval between the substrate 100' and the opposing substrate 300' is maintained constant by the auxiliary layers 420.

When the sealing members 410 and the auxiliary layers 420 are formed on the opposing mother substrate 300 as shown in FIG. 3B, the height t1 of each of the sealing members 410 may be greater than the height t2 of each of the auxiliary layers 420. This is because the height of the sealing members 410 decreases when a laser beam is radiated to the sealing members 410 to melt the sealing members 410 and combine the mother substrate 100 and the opposing mother substrate 300. As a result, the auxiliary layers 420 contact the mother substrate 100 and the mother substrate opposing substrate 300.

In this case, the auxiliary layers 420 still contact the substrate 100' and the opposing substrate 300' after the mother substrate 100 and the mother substrate opposing substrate 300 are cut. In this case, by setting the height t2 of each of the auxiliary layers 420 to be greater than the final height of each of the sealing members 410 after the mother substrate 100 and the opposing mother substrate 300 are combined without the auxiliary layers 420, the generation of the warpage in the mother substrate 100 and/or 300 during the combination of the mother substrate 100 and the opposing mother substrate 300 using the sealing members 410 is prevented or reduced. Also, as shown in FIG. 3D, the interval between the mother substrate 100 and the opposing mother substrate 300 after the combination process is maintained constant because of the consistent height t2 of the auxiliary layers 420.

Figure 4A:
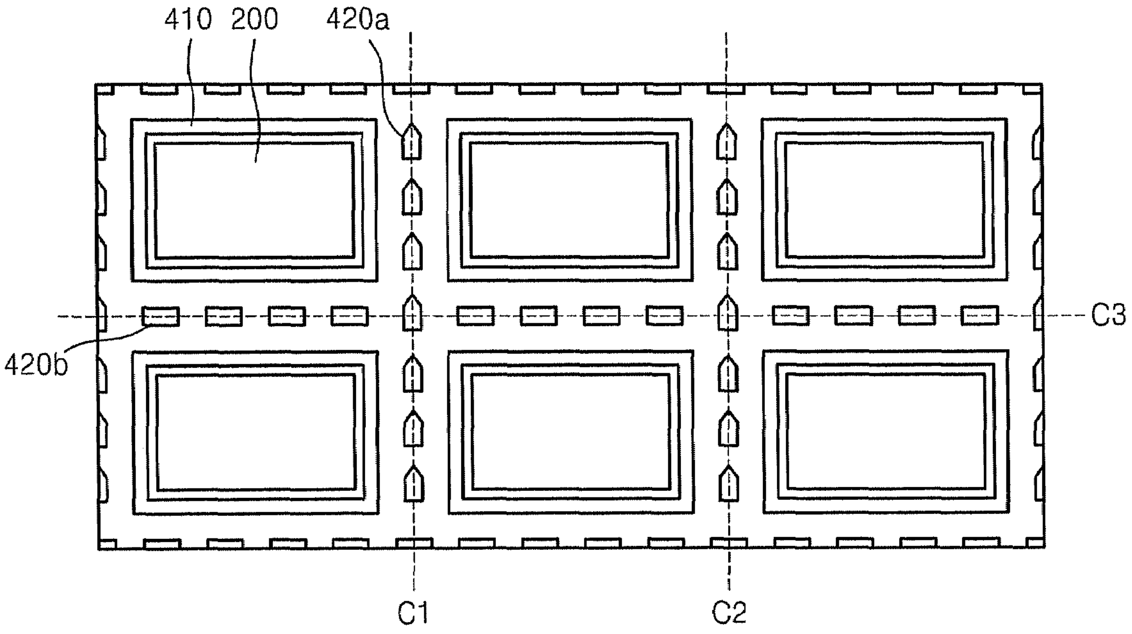
FIGS. 4A-4D are plan views and cross-sectional views showing a manufacturing process of a flat panel display apparatus according to another embodiment of the present invention.

FIGS. 4A-4D are plan views and cross-sectional views showing a manufacturing process of a flat panel display apparatus according to another embodiment of the present invention. FIG. 4A is a conceptual diagram showing a state in which a mother substrate and an opposing mother substrate are combined, as shown in FIG. 3D. A hatched area in some of the illustrated elements does not signify a sectional area, but is added for convenience of illustration. Despite the existence of the opposing substrate, the display units 200, the sealing members 410, and a plurality of auxiliary layers 420*a* and 420*b* are indicated by solid lines for convenience of explanation.

Referring to FIG. 4A, the auxiliary layers 420*a* may have a portion having a section that is perpendicular to the mother substrate and a cross-sectional area having a width that increases in a predetermined direction (for example, a direction from an upper side to a lower side in FIG. 4A). This shape is achieved when the auxiliary layer 420*a* is formed on the opposing mother substrate.

In detail, as shown in FIG. 4A, the auxiliary layers 420*a* and 420*b* are discontinuously formed on the opposing mother substrate. Of the auxiliary layers 420*a* and 420*b*, each of the auxiliary layers 420*a* is formed to have a portion having a section that is perpendicular to the mother substrate and a cross-sectional area that increases in a predetermined direction (for example, a direction from the upper side to the lower side in FIG. 4A). However, aspects of the present invention are not limited thereto and various modifications are available. For example, unlike the illustration of FIG. 4A, all of the auxiliary layers 420*a* and 420*b* may be formed to have a portion having a section that is perpendicular to the mother substrate and a cross-sectional area that increases in a predetermined direction.

As the auxiliary layers 420*a* and 420*b* are formed, the mother substrate and the opposing mother substrate are combined as shown in FIG. 4A. Then, the mother substrate and the opposing mother substrate are cut along lines indicated by the portions C1 and C2, such that a flat display panel as shown in FIG. 4B is obtained.

Figure 4B:
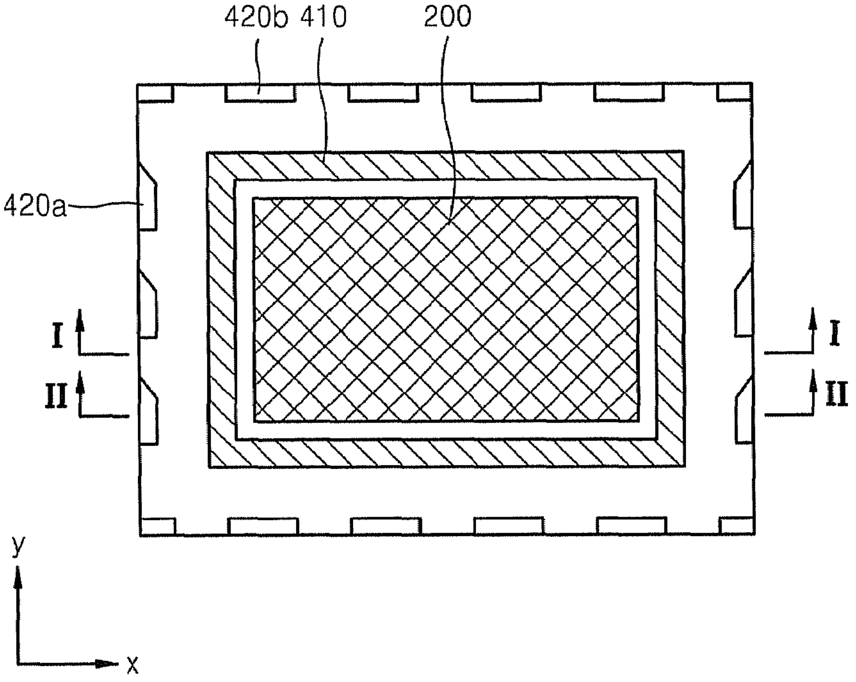
Figure 4C:
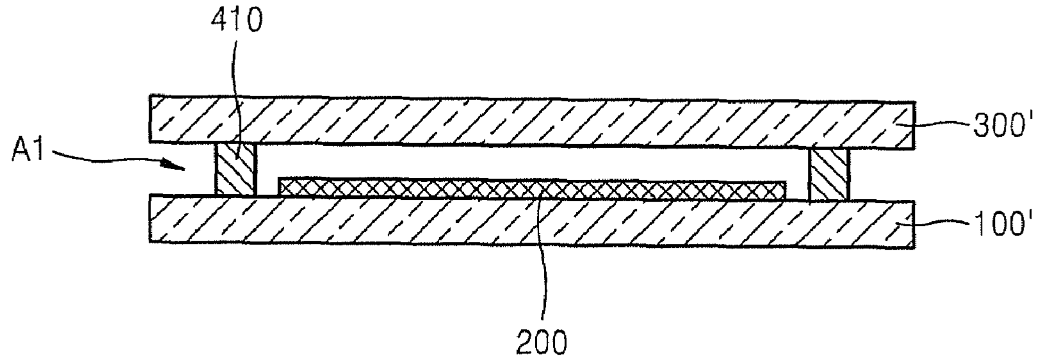
Figure 4D:
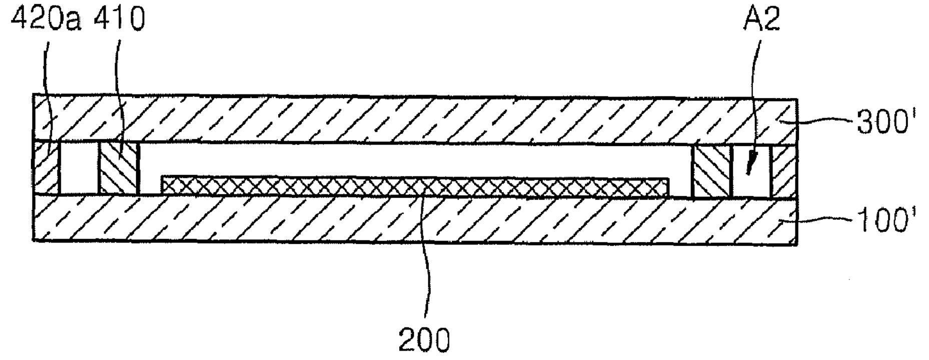
Figure 4E:
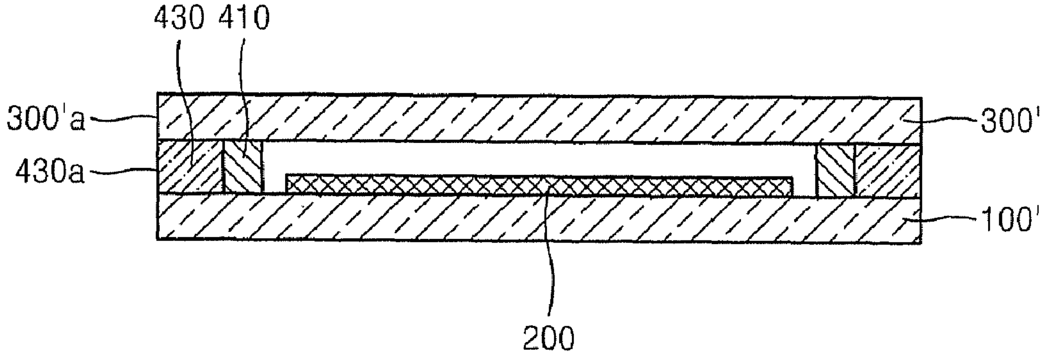
FIG. 4E is a cross-sectional view of a flat panel display apparatus manufactured in the manufacturing process as shown in FIGS. 4A-4D.

FIG. 4C is a cross-sectional view taken along line I-I of FIG. 4B. Referring to FIG. 4C, a space A1 exists between a substrate 100' and an opposing substrate 300' outside the sealing members 410. FIG. 4D is a cross-sectional view taken along line II-II of FIG. 4B. Referring to FIG. 4D, a space A2 exists between the substrate 100' and the opposing substrate 300' between the sealing members 410 and the auxiliary layers 420*a*. When the spaces A1 and A2 exist and a shock or a pressure is applied, the substrate 100' and/or the opposing substrate 300' may be damaged. Thus, a process of filling the spaces outside the sealing members 410 may be performed. As shown in FIG. 4E, the flat panel display apparatus may further include a filling member 430, outside the sealing members 410, filling a space between the substrate 100' and/or the opposing substrate 300'. In this case, an outer end surface 430*a* of the filling member 430 may be aligned with the end surface 300*a* of the opposing substrate 300'.

The filling member 430 may be formed of a material capable of ultraviolet (UV) curing (for example, urethane based and/or acryl based materials) and may be basically transparent or colored by adding an additive. The filling member 430 may be formed by injecting a material having flowability. As shown in FIG. 4B, the filling member forming material may be injected from the upper portion to the lower portion in the flat display panel. Thus, to facilitate intrusion of the filling member forming material in the space between the substrate 100' and/or the opposing substrate 300' of the flat display panel, the auxiliary layer 420*a* at the outer position may have a portion having a section that is perpendicular to the mother substrate and a cross-sectional area that increases in a predetermined direction (for example, a direction from the upper side to the lower side in FIGS. 4A and 4B).

The injection of the filling member 430 may be performed in a state as shown in FIG. 4B after the mother substrate and the opposing mother substrate are cut in a state as shown in FIG. 4A. However, it is understood that aspects of the present invention are not limited thereto and various modifications are available. For example, the cutting of the mother substrate and the opposing mother substrate may be performed after the injection of the filling member 430 is performed in the state as shown in FIG. 4A.

As described above, according to aspects of the present invention, the rate of defects that may result from a process of simultaneously manufacturing a plurality of flat panel display apparatuses is remarkably reduced.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A flat panel display apparatus comprising:

a substrate;

a display unit provided on the substrate;

an opposing substrate facing the substrate such that the display unit is interposed between the substrate and the opposing substrate;

a sealing member provided between the substrate and the opposing substrate to contact the substrate and/or the opposing substrate, and arranged outside or along a periphery of the display unit; and an auxiliary layer provided between the substrate and the opposing substrate to prevent warpage of the substrate and/or the opposing substrate, and arranged along the sealing member and entirely separate from the sealing member.

2. The flat panel display apparatus as claimed in claim 1, wherein the auxiliary layer has an outer end surface aligned with an end surface of the opposing substrate.

3. The flat panel display apparatus as claimed in claim 1, wherein the auxiliary layer contacts the substrate and the opposing substrate.

4. The flat panel display apparatus as claimed in claim 1, wherein the auxiliary layer comprises a portion having a section that is perpendicular to the substrate and a cross-sectional area that increases in a predetermined direction.

5. The flat panel display apparatus as claimed in claim 1, further comprising a plurality of auxiliary layers that are discontinuously arranged along an end portion of the opposing substrate.

6. The flat panel display apparatus as claimed in claim 5, wherein at least one of the plurality of auxiliary layers comprises a portion having a section that is perpendicular to the substrate and a cross-sectional area that increases in a predetermined direction.

7. The flat panel display apparatus as claimed in claim 1, further comprising a filling member provided on an opposite side of the sealing member as compared to the display unit, and filling a space between the substrate and the opposing substrate.

8. The flat panel display apparatus as claimed in claim 7, wherein an outer end surface of the filling member is aligned with an end surface of the opposing substrate.

9. The flat panel display apparatus as claimed in claim 1, wherein the sealing member and the auxiliary layer are formed of a same material.

10. The flat panel display apparatus as claimed in claim 1, wherein the sealing member and/or the auxiliary layer are formed of sealing glass frit.

11. The flat panel display apparatus as claimed in claim 1, wherein the auxiliary layer is provided between an end portion of the substrate and the sealing member.

12. The flat panel display apparatus as claimed in claim 1, wherein a height of the auxiliary layer is equal to a height of the sealing member.

13. A method of manufacturing a flat panel display apparatus, the method comprising:

providing a plurality of display units on a mother substrate;

forming a plurality of sealing members and a plurality of auxiliary layers entirely separate from the sealing members on an opposing mother substrate such that each of the plurality of sealing members is respectively provided outside or along a periphery of each of the plurality of display units and each of the plurality of display units is surrounded by the corresponding sealing members when the opposing mother substrate is arranged to face the mother substrate, or forming a plurality of sealing members and a plurality of auxiliary layers entirely separate from the sealing members on the mother substrate such that each of the plurality of sealing members is respectively provided outside or along a periphery of each of the plurality of display units and each of the plurality of display units is surrounded by the corresponding sealing members;

arranging the mother substrate and the opposing mother substrate to face each other with the plurality of display units interposed between the mother substrate and the opposing mother substrate;

combining the mother substrate and the opposing mother substrate by melting the plurality of sealing members; and forming a plurality of display panels by cutting the mother substrate and the opposing mother substrate such that each display panel has one of the plurality of display units.

14. The method as claimed in claim 13, wherein the forming of the plurality of display panels comprises cutting the mother substrate and the opposing mother substrate along the plurality of auxiliary layers.

15. The method as claimed in claim 13, wherein the forming of the plurality of sealing members and the plurality of auxiliary layers comprises forming the plurality of sealing members and the plurality of auxiliary layers such that a height of each of the plurality of sealing members is greater than a height of each of the plurality of auxiliary layers.

16. The method as claimed in claim 15, wherein the combining of the mother substrate and the opposing mother substrate comprises combining the mother substrate and the opposing mother substrate by melting the plurality of sealing members to reduce the height of each of the plurality of sealing members, such that the plurality of auxiliary layers contact the mother substrate or the opposing mother substrate.

17. The method as claimed in claim 13, wherein one or more of the plurality of auxiliary layers comprises a portion having a section that is perpendicular to the mother substrate and a cross-sectional area of that increases in a predetermined direction.

18. The method as claimed in claim 13, wherein the plurality of auxiliary layers are discontinuously arranged.

19. The method as claimed in claim 13, further comprising forming a plurality of filling members respectively filling a space between the mother substrate and the opposing mother substrate outside an area surrounded by the corresponding sealing members.

20. The method as claimed in claim 13, wherein the plurality of sealing members and the plurality of auxiliary layers are formed of a same material.

21. The method as claimed in claim 13, wherein the plurality of sealing members and/or the plurality of auxiliary layers are formed of sealing glass frit.

* * * * *